(12) United States Patent
Xie et al.

(10) Patent No.: US 10,916,630 B2
(45) Date of Patent: Feb. 9, 2021

(54) NANOSHEET DEVICES WITH IMPROVED ELECTROSTATIC INTEGRITY

(71) Applicant: INTERNATIONAL BUSINESS MACHINES CORPORATION, Armonk, NY (US)

(72) Inventors: Ruilong Xie, Niskayuna, NY (US); Chi-Chun Liu, Altamont, NY (US); Cheng Chi, Jersey City, NJ (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/397,541

(22) Filed: Apr. 29, 2019

(65) Prior Publication Data

US 2020/0343342 A1    Oct. 29, 2020

(51) Int. Cl.
*H01L 29/10* (2006.01)
*H01L 29/66* (2006.01)
*H01L 29/06* (2006.01)
*H01L 29/78* (2006.01)
*H01L 21/308* (2006.01)
(Continued)

(52) U.S. Cl.
CPC .... *H01L 29/1033* (2013.01); *H01L 21/02532* (2013.01); *H01L 21/3086* (2013.01); *H01L 29/0649* (2013.01); *H01L 29/0673* (2013.01); *H01L 29/16* (2013.01);
(Continued)

(58) Field of Classification Search
CPC ............. H01L 29/0657; H01L 29/0665; H01L 29/0669; H01L 29/0673; H01L 29/78696; H01L 29/785; H01L 29/775; H01L 29/66439; H01L 29/1033; H01L 21/3086; H01L 29/6681; H01L 29/66545; H01L 29/66553

See application file for complete search history.

(56) References Cited

U.S. PATENT DOCUMENTS 8,753,942 B2    6/2014    Kuhn et al.
9,466,668 B2    10/2016    Colinge et al.
(Continued)

FOREIGN PATENT DOCUMENTS

KR    20160068680    6/2016

OTHER PUBLICATIONS

Po-Yi Kuo et al., "Implantation Free GAA Double Spacer Poly-Si Nanowires Channel Junctionless FETs with Sub-1V Gate Operation and Near Ideal Subthreshold Swing", 2015 IEEE International Electron Devices Meeting (IEDM), Washington, DC, Dec. 2015, pp. 6.3.1-6.3.4.

*Primary Examiner* — Thanhha S Pham
(74) *Attorney, Agent, or Firm* — Tutunjian & Bitetto, P.C.; Douglas Pearson

(57) ABSTRACT

Semiconductor devices and methods of forming the same include forming spacers on respective sidewalls above a stack of alternating channel layers and sacrificial layers, leaving an opening between the spacers. The stack is etched, between the spacers, to form a central opening in the stack that separates the channel layers into respective pairs of channel structures. The sacrificial material is etched away to expose top and bottom surfaces of the channel structures. A gate stack is formed on, between, and around the channel structures, including in the central opening between pairs of channel structures.

16 Claims, 10 Drawing Sheets

(51) Int. Cl.
*H01L 21/02* (2006.01)
*H01L 29/16* (2006.01)

(52) U.S. Cl.
CPC .... *H01L 29/6681* (2013.01); *H01L 29/66545* (2013.01); *H01L 29/66553* (2013.01); *H01L 29/785* (2013.01)

(56) References Cited

U.S. PATENT DOCUMENTS

| | | |
|---|---|---|
| 9,484,447 B2 | 11/2016 | Kim et al. |
| 9,799,748 B1 | 10/2017 | Xie et al. |
| 9,893,161 B2 | 2/2018 | Nakamura et al. |
| 9,947,804 B1 | 4/2018 | Frougier et al. |
| 10,008,583 B1 | 6/2018 | Rodder et al. |
| 10,014,390 B1 | 7/2018 | Bouche et al. |
| 10,157,992 B2 | 12/2018 | Badaroglu et al. |
| 2018/0114727 A1 | 4/2018 | Rodder et al. |
| 2018/0175194 A1 | 6/2018 | Reboh et al. |
| 2018/0301531 A1 | 10/2018 | Xie |
| 2018/0331180 A1* | 11/2018 | Chang ............... H01L 29/42392 |
| 2018/0342596 A1 | 11/2018 | Lee et al. |
| 2018/0351001 A1 | 12/2018 | Zhang et al. |

* cited by examiner

NANOSHEET DEVICES WITH IMPROVED ELECTROSTATIC INTEGRITY

BACKGROUND

The present invention generally relates to semiconductor device fabrication and, more particularly, to nanosheet field effect transistors that have improved electrostatic integrity without sacrificing much effective channel width.

Gate-all-around transistor architectures use nano-scale channel architectures that have a gate stack formed above, below, and on either side of the channel. The electrostatic integrity of these structures has implications for control of the short-channel effect. Electrostatic integrity is generally superior for nanowire and nano-ellipse devices as compared to nanosheet devices, but the use of such devices may decrease the effective channel width for a given amount of chip area.

SUMMARY

A method of forming a semiconductor device includes forming spacers on respective sidewalls above a stack of alternating channel layers and sacrificial layers, leaving an opening between the spacers. The stack is etched, between the spacers, to form a central opening in the stack that separates the channel layers into respective pairs of channel structures. The sacrificial material is etched away to expose top and bottom surfaces of the channel structures. A gate stack is formed on, between, and around the channel structures, including in the central opening between pairs of channel structures.

A method of forming a semiconductor device includes forming spacers on respective sidewalls above a stack of alternating channel layers and sacrificial layers, leaving an opening between the spacers. The stack between the spacers to form a central opening in the stack that separates the channel layers into respective pairs of channel structures. Sacrificial material is deposited in the central opening in the stack. A dummy gate is formed over the stack. The stack of alternating channel layers is etched away in regions not covered by the dummy gate. Inner spacers are formed by recessing the sacrificial material relative to the channel structures and depositing a dielectric material in the recesses. Source and drain regions are grown from sidewalls of the channel structures. The sacrificial material is etched away to expose top and bottom surfaces of the channel structures. A gate stack is formed on, between, and around the channel structures, including in the central opening between pairs of channel structures.

A semiconductor device includes channel structures that are arranged in vertically aligned pairs of channel structures. A gate stack is formed around all of the plurality of channel structures, filling a space between each pair of channel structures. Inner spacers are formed at respective ends of the channel structures, each having a vertical central portion and horizontal portions that extend outward from sides of the central portion, between the channels.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide nanosheet gate-all-around devices that cut the nanosheets before forming the gate stack. This cut limits the detrimental effect of degraded electrostatic integrity without substantially decreasing the effective channel width. The present embodiments can be employed with semiconductor devices having varying channel widths. After formation of a stack of nanosheets, an anisotropic etch cuts the nanosheets into halves, with a relatively narrow gap between the two halves of each sheet. When the gate stack is then formed, it completely surrounds each half of each nanosheet.

Figure 1:
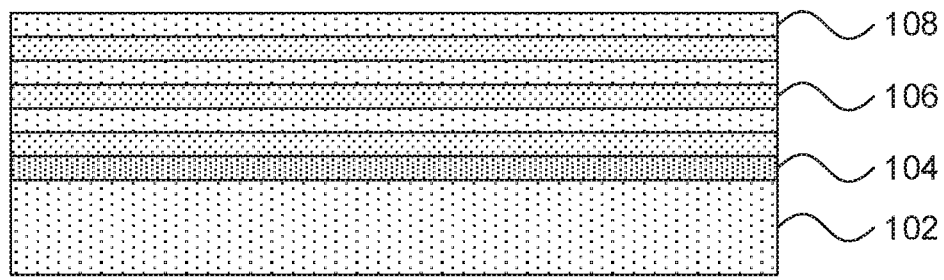
FIG. 1 is a cross-sectional view of a step in the formation of a semiconductor device having improved electrostatic integrity, showing a stack of alternating semiconductor layers in accordance with an embodiment of the present invention.

Referring now to the drawings in which like numerals represent the same or similar elements and initially to FIG. 1, a cross-sectional view of a step in the fabrication of a gate-all-around field effect transistor (FET) is shown. A stack of semiconductor layers is formed on a semiconductor substrate 102.

The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate.

The stack of semiconductor layers can be formed on the semiconductor substrate 102 by any appropriate deposition process, but it is specifically contemplated that epitaxial growth can be used and that the semiconductor layers can therefore be formed from a semiconductor material that has a compatible lattice constant with the lattice constant of the semiconductor substrate 102. In an embodiment where the semiconductor substrate is formed from silicon, germanium, or silicon germanium, a base layer 104 can be formed from silicon germanium having a germanium concentration of about 65%, though other materials and other concentrations can be used instead. The remaining layers of the stack are formed from alternating sacrificial material 106 and channel material 108. Following the above example, the sacrificial layers 106 can be formed from silicon germanium having a germanium concentration of about 30% and the channel layers 108 can be formed from silicon, though other materials and other concentrations can be used instead. Although the stack is shown as having three channel layers 108, it should be understood that the present embodiments can have various numbers of channel layers 106, including embodiments with only a single channel layer 106.

It should be noted that the materials are selected of the stack of layers are selected to have etch selectivity with respect to one another. As used herein, the term "selective" in reference to a material removal process denotes that the rate of material removal for a first material is greater than the rate of removal for at least another material of the structure to which the material removal process is being applied. Differing levels of germanium concentration in a silicon germanium layer will result in different etching rates under particular etchants.

The thickness of the layers in the stack will depend on the particular materials used. For example, because the lattice match between silicon and silicon germanium is imperfect, growing a layer of silicon germanium on a layer of silicon can result in defects if the layer is made too thick. In some exemplary embodiments, the thickness of the sacrificial layers 106 and the channel layers can be in the range between about 5 nm and about 15 nm, though it should be understood that other thicknesses can also be used.

Figure 2:
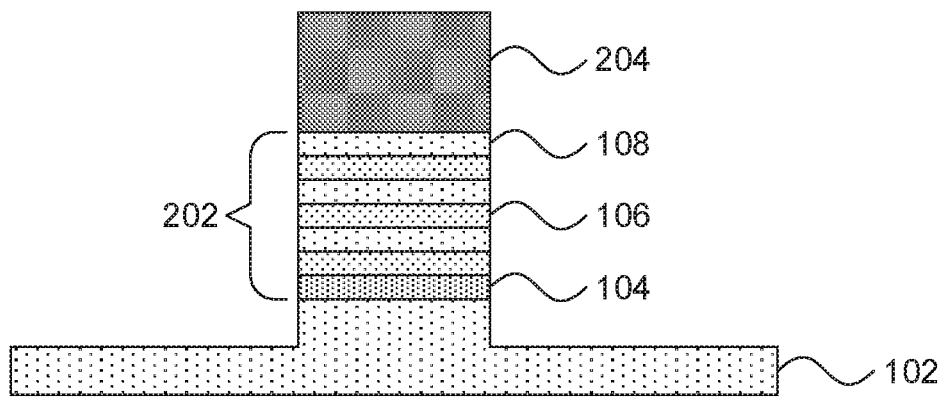
FIG. 2 is a cross-sectional view of a step in the formation of a semiconductor device having improved electrostatic integrity, showing the formation of a fin from the stack of alternating semiconductor layers in accordance with an embodiment of the present invention.

Referring now to FIG. 2, a cross-sectional view of a step in the fabrication of a gate-all-around FET is shown. The stack is etched to form a fin 202 using any appropriate anisotropic etch. It is specifically contemplated that the fin 202 can have a width between about 20 nm and about 50 nm. A hardmask 204 is used to define the fin pattern and can be formed from any appropriate material, such as silicon nitride. In some embodiments, photolithography can be used to define the fin pattern. Although only one fin is shown herein, it should be understood that any number of fins, in any appropriate arrangement and location on the chip, can be defined in the same manner.

As used herein, an "anisotropic etch process" denotes a material removal process in which the etch rate in the direction normal to the surface to be etched is greater than in the direction parallel to the surface to be etched. For example, reactive ion etching (RIE) is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. Alternatively, the fin 202 can be formed by spacer imaging transfer.

Figure 3:
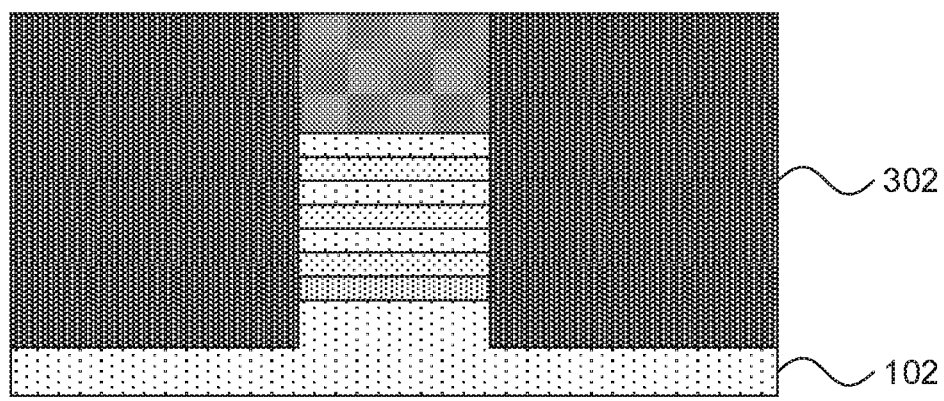
FIG. 3 is a cross-sectional view of a step in the formation of a semiconductor device having improved electrostatic integrity, showing the formation of a dielectric layer around the fin in accordance with an embodiment of the present invention.

Referring now to FIG. 3, a cross-sectional view of a step in the fabrication of a gate-all-around FET is shown. A layer of dielectric material 302 is formed over and around the fin 202. It is specifically contemplated that the dielectric material 302 can be formed from silicon dioxide, but it should be understood that any dielectric material that has appropriate etch selectivity can be used instead. In particular, the layer of dielectric material 302 has etch selectivity with respect to the hardmask 204 and the semiconductor layers 102, 104, 106, and 108. After the dielectric material is deposited, it is polished down to the level of the top surface of the hardmask using, e.g., a chemical mechanical planarization (CMP) process.

CMP is performed using, e.g., a chemical or granular slurry and mechanical force to gradually remove upper layers of the device. The slurry may be formulated to be unable to dissolve, for example, the hardmask material, resulting in the CMP process's inability to proceed any farther than that layer.

The dielectric layer 302 may be formed by any appropriate process including, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 4:
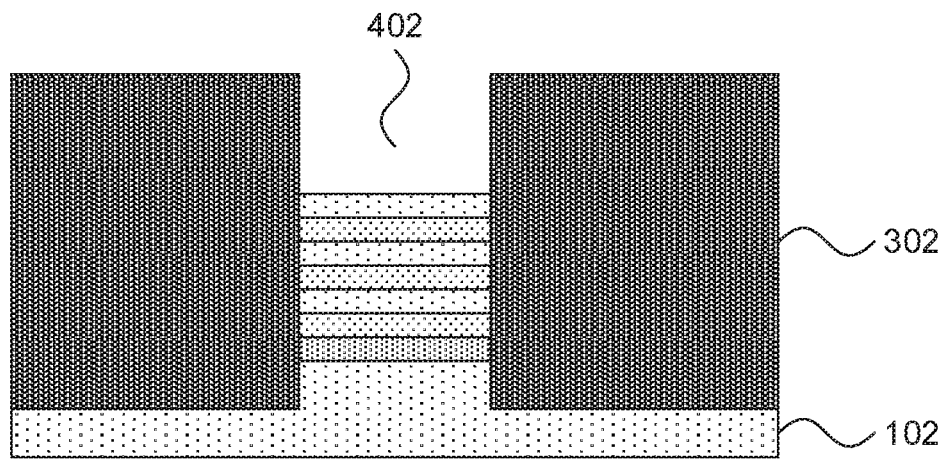
FIG. 4 is a cross-sectional view of a step in the formation of a semiconductor device having improved electrostatic integrity, showing the removal of a fin mask in accordance with an embodiment of the present invention.

Referring now to FIG. 4, a cross-sectional view of a step in the fabrication of a gate-all-around FET is shown. The hardmask 202 is etched away using any appropriately selective etch, leaving behind a gap 402 above the stack of semiconductor layers.

Figure 5:
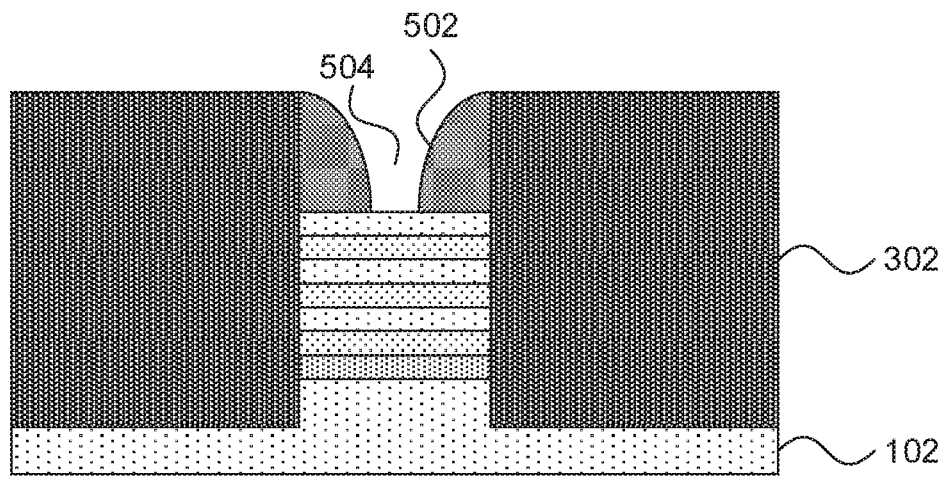
FIG. 5 is a cross-sectional view of a step in the formation of a semiconductor device having improved electrostatic integrity, showing the formation of spacers in a recess over the stack in accordance with an embodiment of the present invention.

Referring now to FIG. 5, a cross-sectional view of a step in the fabrication of a gate-all-around FET is shown. A layer of spacer material is conformally deposited on the exposed surfaces of the gap 402 and is then etched away from horizontal surfaces using an anisotropic etch to create sidewall spacers 502. These spacers define an opening 504 between them that can be any appropriate size, but is specifically contemplated as being about 10 nm or less in width. It is specifically contemplated that the sidewall spacers 502 can be formed from silicon nitride, but any appropriate material that has etch selectivity with respect to the semiconductor layers of the fin 202 can be used instead.

Figure 6:
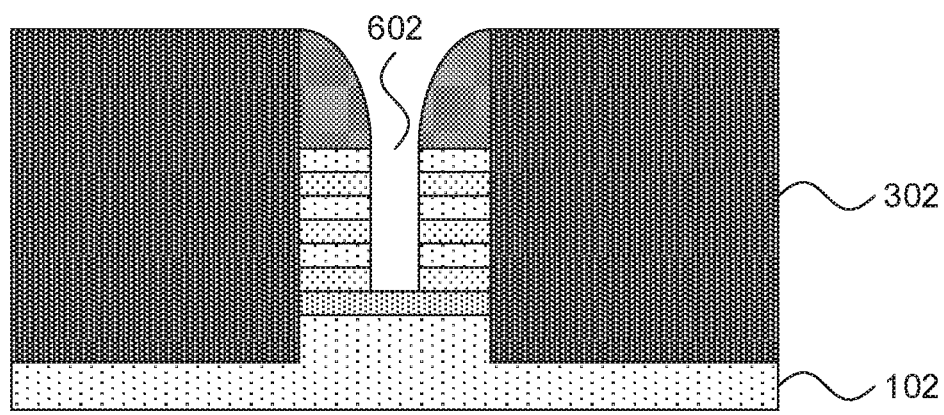
FIG. 6 is a cross-sectional view of a step in the formation of a semiconductor device having improved electrostatic integrity, showing etching a central opening in the stack in accordance with an embodiment of the present invention.

Referring now to FIG. 6, a cross-sectional view of a step in the fabrication of a gate-all-around FET is shown. The sidewall spacers 502 are used as a mask for an anisotropic etch of the semiconductor layers of the fin 202, forming a gap 602 that separates regions of the layers into two fins. Although the etch is shown as being performed down to the base layer 104, it should be noted that the etch can stop anywhere within the lowest sacrificial layer 106. In some embodiments, alternating selective etches can be used to remove the alternating semiconductor layers one at a time.

Figure 7:
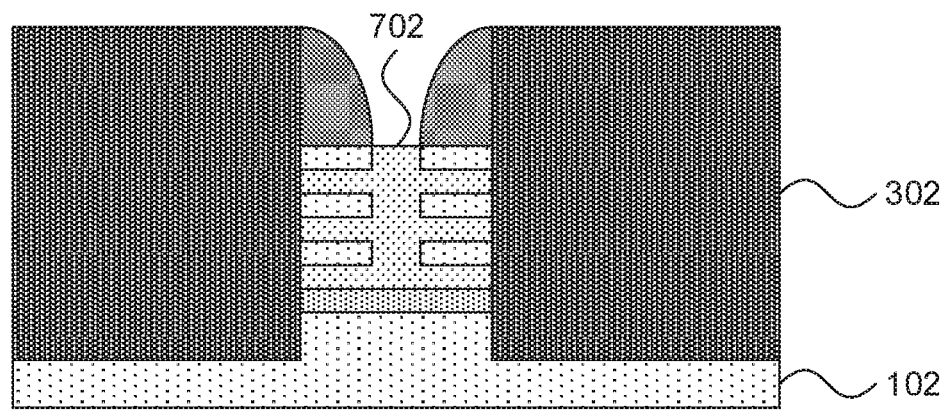
FIG. 7 is a cross-sectional view of a step in the formation of a semiconductor device having improved electrostatic integrity, showing filling in the central opening with sacrificial material in accordance with an embodiment of the present invention.

Referring now to FIG. 7, a cross-sectional view of a step in the fabrication of a gate-all-around FET is shown. Additional sacrificial material is filled in and then etched back to connect the severed sacrificial layers 106 and form a sacrificial structure 702. Filling the gap 602 with sacrificial material prevents subsequent oxide depositions from pinching off the opening, which would make it difficult to remove the obstruction. It is specifically contemplated that the same sacrificial material can be used to fill in between the severed sacrificial layers 106 as is used to form the sacrificial layers 106, but it should be understood that other sacrificial materials can be used instead.

Figure 8:
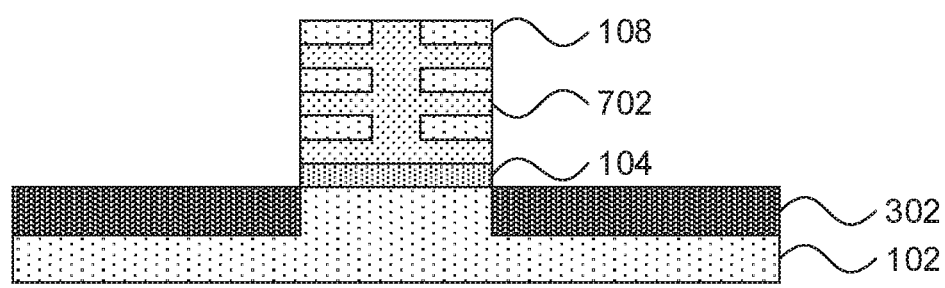
FIG. 8 is a cross-sectional view of a step in the formation of a semiconductor device having improved electrostatic integrity, showing the removal of the spacers and etching back the dielectric layer in accordance with an embodiment of the present invention.

Referring now to FIG. 8, a cross-sectional view of a step in the fabrication of a gate-all-around FET is shown. The spacers 502 are stripped away and the dielectric layer 302 is recessed, using any appropriate etch or etches, to expose the channel layers 108 and the sides of the sacrificial structure 702. In some exemplary embodiments, the width of the central portion of the sacrificial structure can be between about 6 nm and about 10 nm, while the width of the channel layers 108 can be between about 6 nm and about 20 nm. The remaining dielectric layer 302 serves as shallow trench isolation for electrical isolation between fins.

Figure 9:
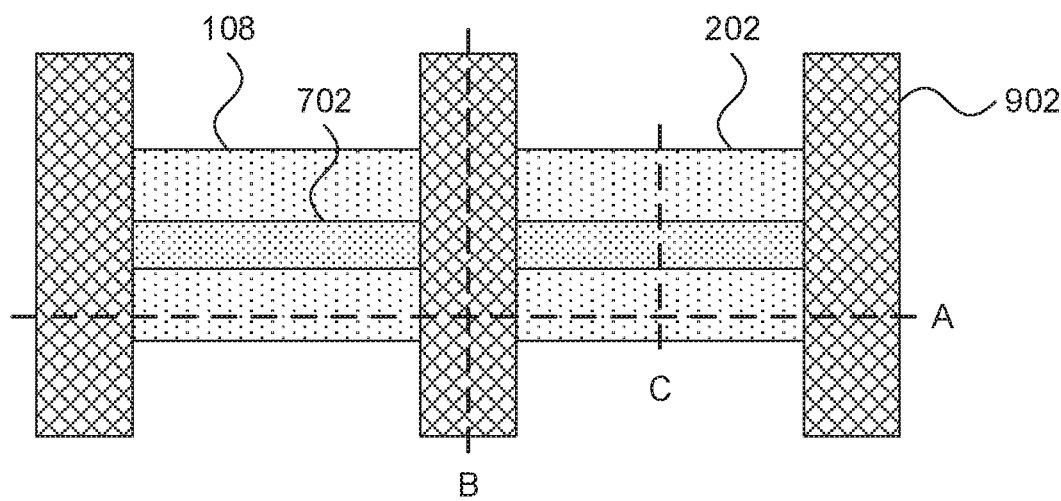
FIG. 9 is a top-down view of a step in the formation of a semiconductor device having improved electrostatic integrity, showing the formation of dummy gates and different cross-sections in accordance with an embodiment of the present invention.

Referring now to FIG. 9, a top-down view of a step in the fabrication of a gate-all-around FET is shown. In some embodiments, each step to this point can be performed along the entire length of the fins 202. At this stage, dummy gates 902 are formed across the fin 202. The dummy gates 902 can be formed from any appropriate material such as, e.g., a thin layer of SiO2 followed by polysilicon deposition, and can be further patterned using photolithography or any other appropriate fabrication process.

FIG. 9 identifies three different planes that will be used hereinafter to identify respective cross-sections. Cross-section A is taken parallel to the fin 202 and cuts across the dummy gates 902. Cross-section A is taken off-center on the fin, so as to cut through the channel layers 108. Cross-section B is taken through and parallel to a dummy gate 902, across the fin 202. Cross-section C is taken across the fin 202 in a source/drain region, outside of the dummy gates 902.

Figure 10:
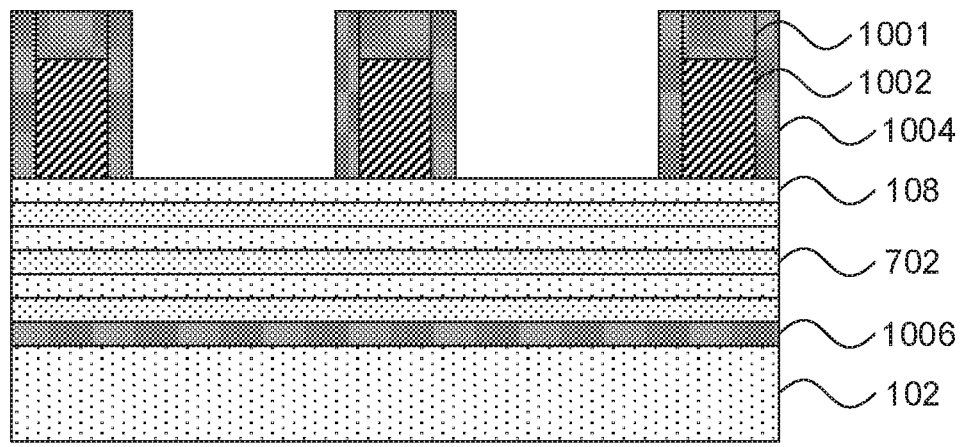
FIG. 10 is a cross-sectional view of a step in the formation of a semiconductor device having improved electrostatic integrity, showing the formation of dummy gates and the replacement of a base layer with a bottom isolation layer in accordance with an embodiment of the present invention.

Referring now to FIG. 10, a cross-sectional view along cross-section A of a step in the fabrication of a gate-all-around FET is shown. Dummy gates 1002 are formed over the fin 202 using any appropriate fabrication process, such as photolithography and anisotropic etching using hardmasks 1001. The base layer 104 is isotropically etched away from under the stack, with the dummy fins 1002 suspending the alternating layers. A layer of dielectric material is then conformally deposited, filling the space underneath the fin 102 and on sidewalls of the dummy fins 1002. The dielectric material is then anisotropically etched away, leaving a bottom isolation layer 1006 and sidewall spacers 1004. As noted above, the dummy gates 1002 can be formed from any appropriate material. Because cross-section A is taken off-center on the fin 202, alternating layers of channel material 108 and sacrificial material 702 are shown.

Figure 11:
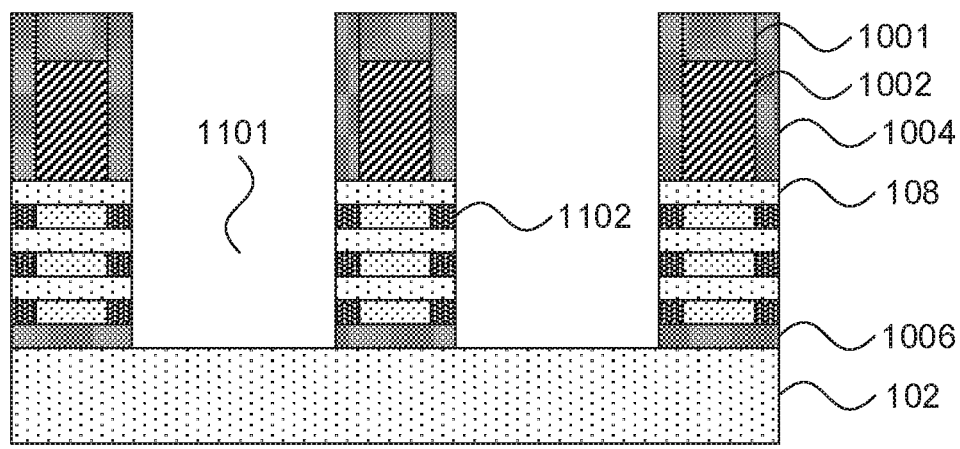
FIG. 11 is a cross-sectional view of a step in the formation of a semiconductor device having improved electrostatic integrity, showing the removal of the stack of alternating layers from regions not covered by the dummy gates in accordance with an embodiment of the present invention.

Referring now to FIG. 11, a cross-sectional view along cross-section A of a step in the fabrication of a gate-all-around FET is shown. The dummy gates 1002 and sidewalls 1004 are used as a mask for an anisotropic etch that removes material from the channel layers 108 and the sacrificial structure 702 in source/drain regions 1101. The exposed surfaces of the sacrificial structure 702 are then recessed relative to the channel layers 108 and the resulting recesses are filled with inner spacer material 1102. The inner spacer material 1102 can be formed from any appropriate dielectric material, such as silicon dioxide, by a conformal deposition process that is followed by an anisotropic etch that removes any of the dielectric material that is not protected within the recesses.

It should be noted that, because the inner spacers 1102 are formed by first recessing the sacrificial structure 702, the inner spacers will share its overall shape, as shown in FIG. 8. Thus, the inner spacers 1102 at each side of the channels will be joined into a respective spacer structure that includes multiple horizontal layers that are joined by a central portion.

Figure 12:
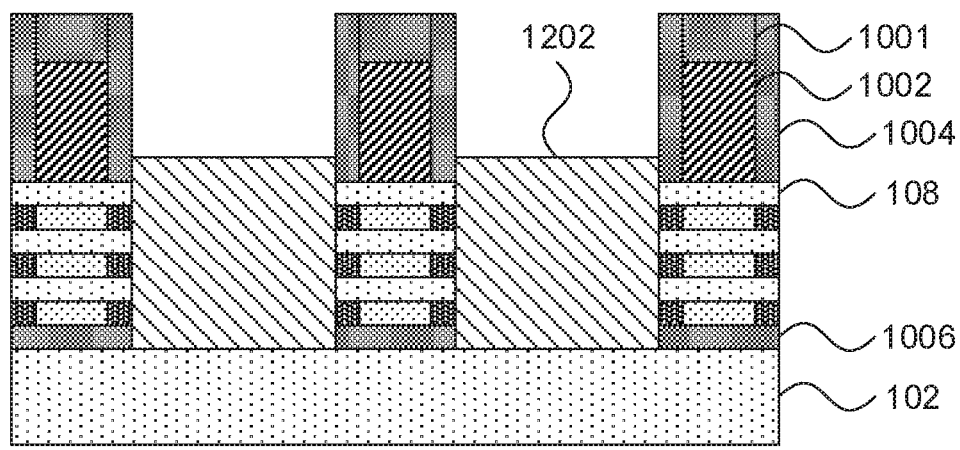
FIG. 12 is a cross-sectional view of a step in the formation of a semiconductor device having improved electrostatic integrity, showing the formation of source/drain structures in accordance with an embodiment of the present invention.

Referring now to FIG. 12, a cross-sectional view along cross-section A of a step in the fabrication of a gate-all-around FET is shown. Source and drain structures 1202 are formed in the source/drain regions 1101. The source and drain structures 1202 can be formed by epitaxial growth from exposed surfaces of the channel layers. It is specifically contemplated that the source and drain structures 1202 can be formed from doped silicon, but it should be understood that any semiconductor material that has a compatible crystalline structure with the channel layers 108 can be used instead. It should further be noted that any appropriate n-type or p-type dopant can be used. The source and drain structures 1202 can be doped in situ during epitaxial growth or can be doped after growth by, e.g., ion implantation.

Figure 13:
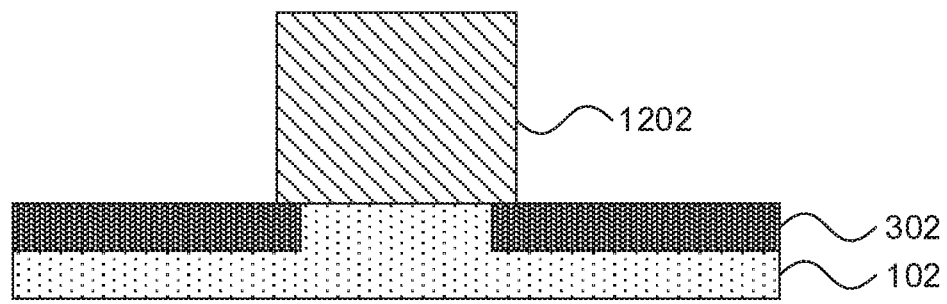
FIG. 13 is a cross-sectional view of a step in the formation of a semiconductor device having improved electrostatic integrity, showing the formation of source/drain structures in accordance with an embodiment of the present invention.

Referring now to FIG. 13, a cross-sectional view along cross-section C of a step in the fabrication of a gate-all-around FET is shown. This cross-section shows the source and drain structures 1202 as having replaced the fin structure that was present in this region.

Figure 14:
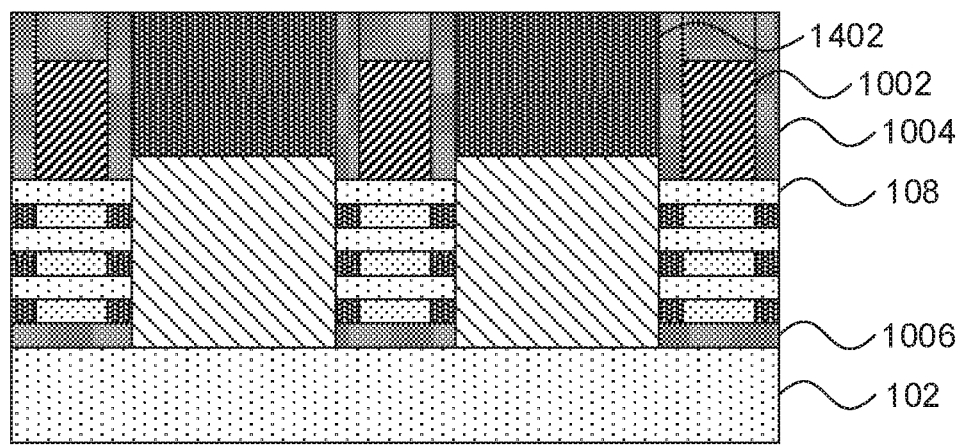
FIG. 14 is a cross-sectional view of a step in the formation of a semiconductor device having improved electrostatic integrity, showing a stack of alternating semiconductor layers in accordance with an embodiment of the present invention.

Referring now to FIG. 14, a cross-sectional view along cross-section A of a step in the fabrication of a gate-all-around FET is shown. A layer of interlayer dielectric (ILD) 1402 is deposited over the source/drain regions. The ILD dielectric material can be deposited by any appropriate process and then polished down to the height of the dummy gates 1002 by, e.g., a CMP process.

Figure 15:
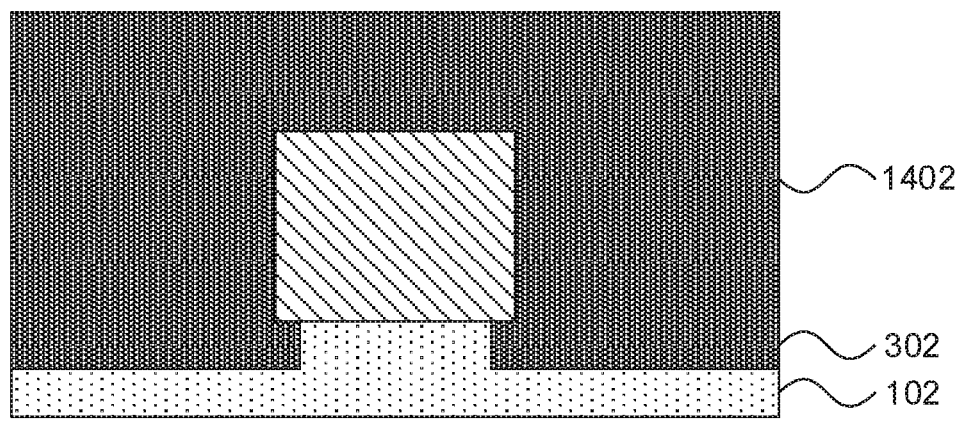
FIG. 15 is a cross-sectional view of a step in the formation of a semiconductor device having improved electrostatic integrity, showing a stack of alternating semiconductor layers in accordance with an embodiment of the present invention.

Referring now to FIG. 15, a cross-sectional view along cross-section C of a step in the fabrication of a gate-all-around FET is shown. The ILD dielectric layer 1402 is shown as surrounding the source/drain structures 1202.

Figure 16:
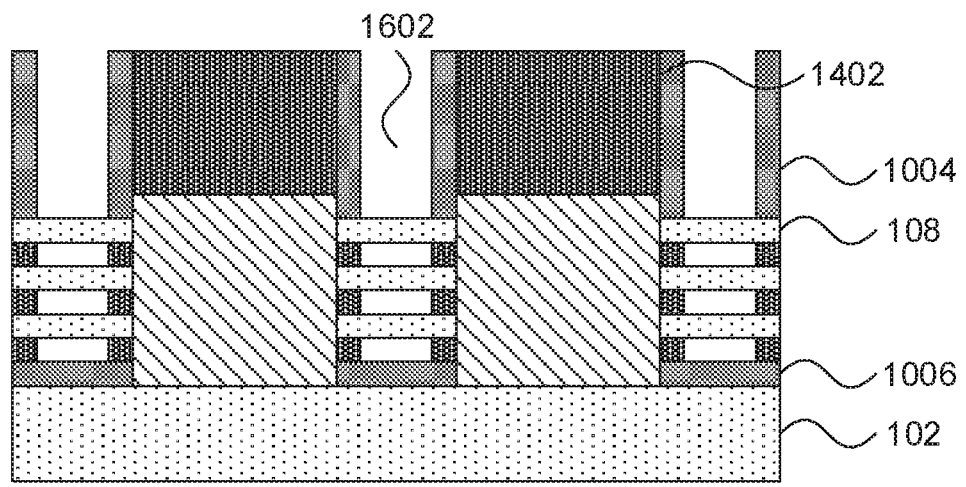
FIG. 16 is a cross-sectional view of a step in the formation of a semiconductor device having improved electrostatic integrity, showing the removal of the dummy gate and the sacrificial material in accordance with an embodiment of the present invention.

Referring now to FIG. 16, a cross-sectional view along cross-section A of a step in the fabrication of a gate-all-around FET is shown. The dummy gate hardmasks 1001, the dummy gates 1002, and the remaining sacrificial structures 702 are etched away to expose top and bottom surfaces of the channel layers 108.

Figure 17:
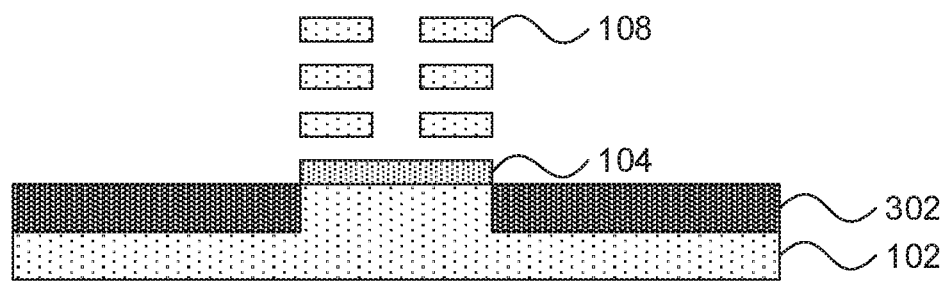
FIG. 17 is a cross-sectional view of a step in the formation of a semiconductor device having improved electrostatic integrity, showing the removal of the sacrificial material in accordance with an embodiment of the present invention.

Referring now to FIG. 17, a cross-sectional view along cross-section B of a step in the fabrication of a gate-all-around FET is shown. The channel layers 108 are shown suspended in the gap 1602, with the sacrificial structure 702 having been etched away around them.

Figure 18:
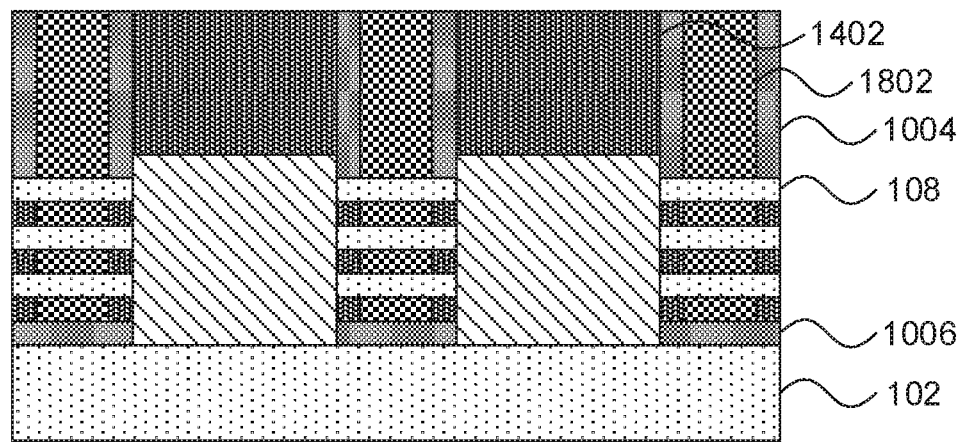
FIG. 18 is a cross-sectional view of a step in the formation of a semiconductor device having improved electrostatic integrity, showing the formation of a gate stack in accordance with an embodiment of the present invention.

Referring now to FIG. 18, a cross-sectional view along cross-section A of a step in the fabrication of a gate-all-around FET is shown. A gate stack 1802 is deposited over, between, and around the channel layers 108. The gate stack can include, for example, a gate dielectric and a gate conductor. In some embodiments, the gate stack can also include a work function metal.

The gate dielectric can include any appropriate dielectric material that is conformally deposited on and around the channel layers 108. It is specifically contemplated that a high-k dielectric material can be used, defined as a material having a dielectric constant that is higher than that of silicon dioxide. Examples of high-k dielectric materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum and aluminum.

The gate conductor can be formed from any appropriate conductive metal such as, e.g., tungsten, nickel, titanium, molybdenum, tantalum, copper, platinum, silver, gold, ruthenium, iridium, rhenium, rhodium, and alloys thereof. The gate conductor can may alternatively be formed from a doped semiconductor material such as, e.g., doped polysilicon.

A work function metal can be selected according to a specified threshold voltage shift. Exemplary work function metals include titanium nitride, titanium aluminum, titanium aluminum nitride, tantalum nitride, hafnium nitride, hafnium silicon, ruthenium, platinum, molybdenum, cobalt, and alloys thereof.

Figure 19:
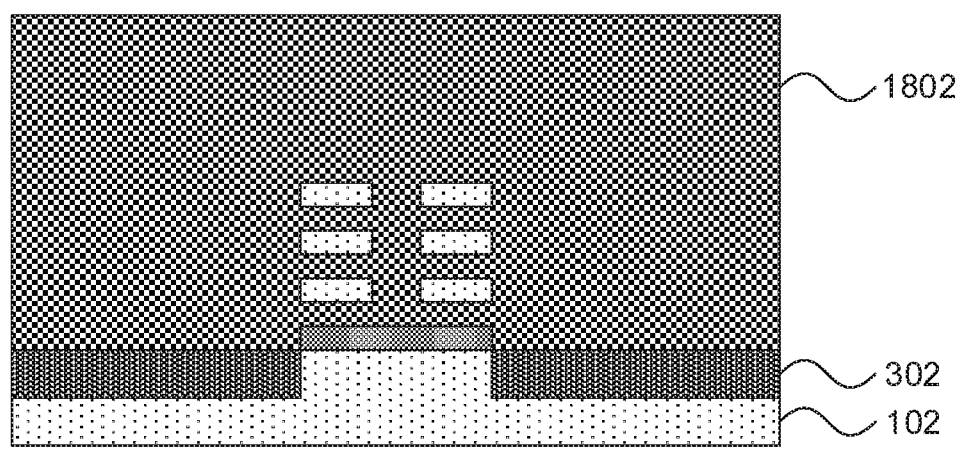
FIG. 19 is a cross-sectional view of a step in the formation of a semiconductor device having improved electrostatic integrity, showing the formation of a gate stack in accordance with an embodiment of the present invention.

Referring now to FIG. 19, a cross-sectional view along cross-section B of a step in the fabrication of a gate-all-around FET is shown. The gate stack 1902 is shown surrounding the channel layers 108. Because the break between adjacent channel layers 108 is relatively small, and because the vertical side surfaces contribute to the effective channel width, the effective channel width of these channel layers 108 is not much reduced from the channel width of a full nanosheet. The break between adjacent channel layers 108 further improves the electrostatic integrity of the channel relative to embodiments that use nanowires.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation addition to the orientation depicted in the FIGS. For example, if the device in the FIGS. is turned over, elements described as "below" or "beneath" other elements or features would then be oriented "above" the other e rets or features. Thus, the term "below" can encompass both an ion of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 20:
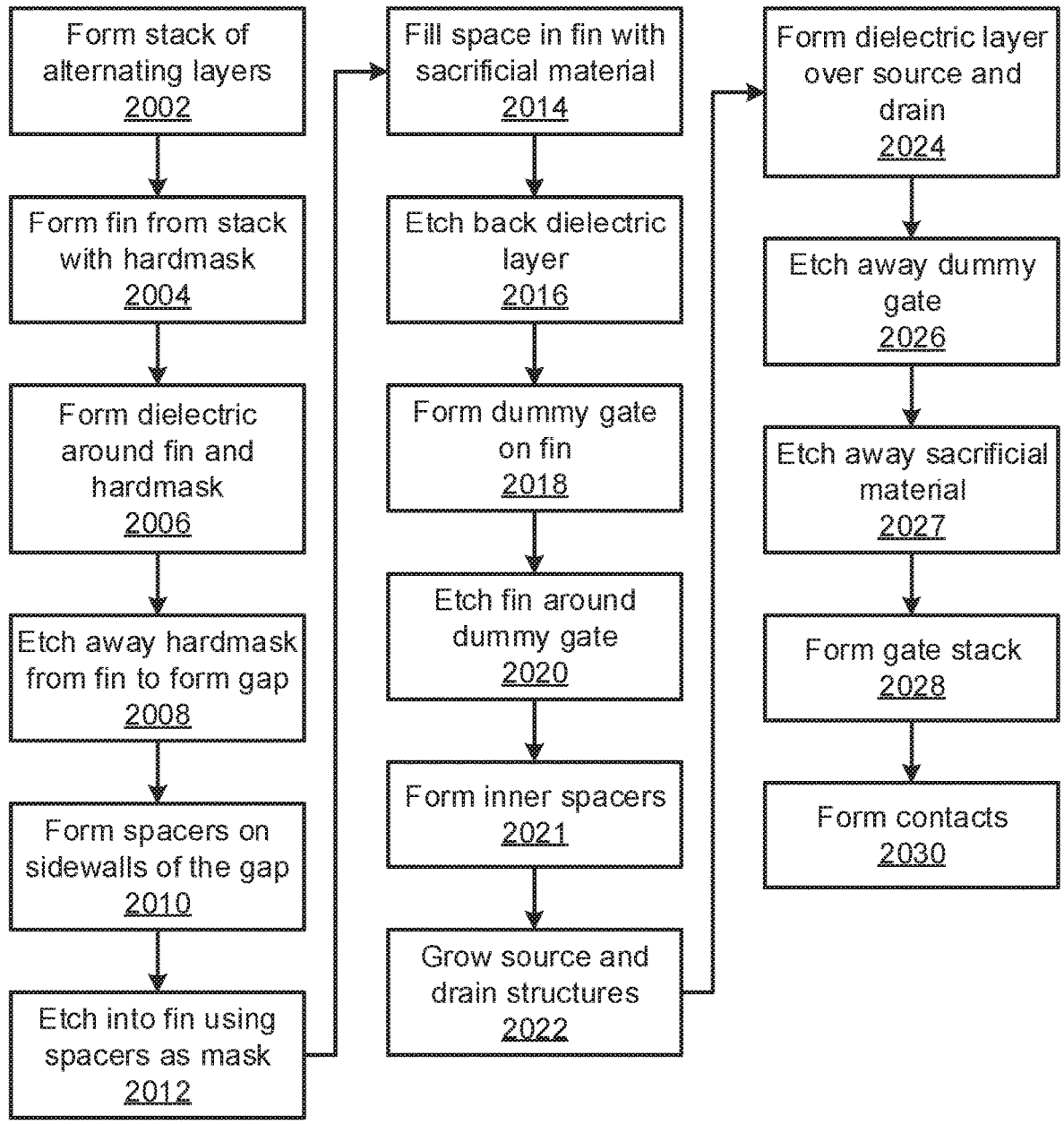
FIG. 20 is a block/flow diagram of a method of forming a semiconductor device having improved electrostatic integrity in accordance with an embodiment of the present invention.

Referring now to FIG. 20, a method of forming a semiconductor device is shown. Block 2002 forms a stack of alternating channel layers 108 and sacrificial layers 106 on a base layer 104. It is specifically contemplated that the channel layers 108 can be formed from silicon and that the sacrificial layers 106 and base layer 104 can be formed from silicon germanium with differing germanium concentrations, although other materials can be used instead. It is contemplated that the alternating layers can be grown from a semiconductor substrate 102 and from one another using epitaxial growth. Block 2004 etches the stack of layers to form a fin 202 using any appropriate anisotropic etch. It is specifically contemplated that block 2004 can use photolithography, with a hardmask 204 defining the fin pattern.

Block 2006 forms a dielectric layer 302 around the fin 202. Block 2008 etches away the hardmask to leave a gap 402 above the fin 202. Block 2010 then forms spacers 502 on the sidewalls of the gap 402, leaving an opening 504. It is specifically contemplated that the spacers 502 can be formed from silicon nitride and can be formed using a conformal deposition process, such as CVD or ALD.

Block 2012 etches down into the fin 202 using one or more anisotropic etches, down to the base layer 104, using the sidewall spacers 502 as a mask. This creates a gap 602 between respective sides of the fin 202. Block 2014 fills the gap 602 with additional sacrificial material to form sacrificial structure 702. It is specifically contemplated that the same material can be used as the sacrificial layers 106, but alternative materials may be used instead, for example any material that can be etched away selective to the channel layers 108.

Block 2016 etches back the dielectric layer 302 to expose the fin 202. Block 2018 forms dummy gates 1002 over the fin 202 and block 2020 etches the fin 202 away around the dummy gates 1002. Block 2021 forms inner spacers 1102 by recessing the sacrificial structure 702 relative to the channel layers 108 and forming dielectric in the recesses. Block 2022 grows source and drain structures 1202 from the exposed sidewalls of the channel layers 108.

Block 2024 deposits a dielectric layer 1402 over the source/drain structures 1202. Block 2026 then etches away the dummy gate to expose the fin 202. Block 2027 etches away the sacrificial structure 702 using an isotropic etch that removes sacrificial material from between the channel layers 108. Block 2028 then forms a gate stack 1802 over, between, and around the channel layers 108, conformally depositing a gate dielectric, a gate conductor, and an optional work function metal. Block 2030 completes the device by forming electrical contacts (not shown) to the gate stack 1802 and to the source/drain structures 1202.

Figure 21:
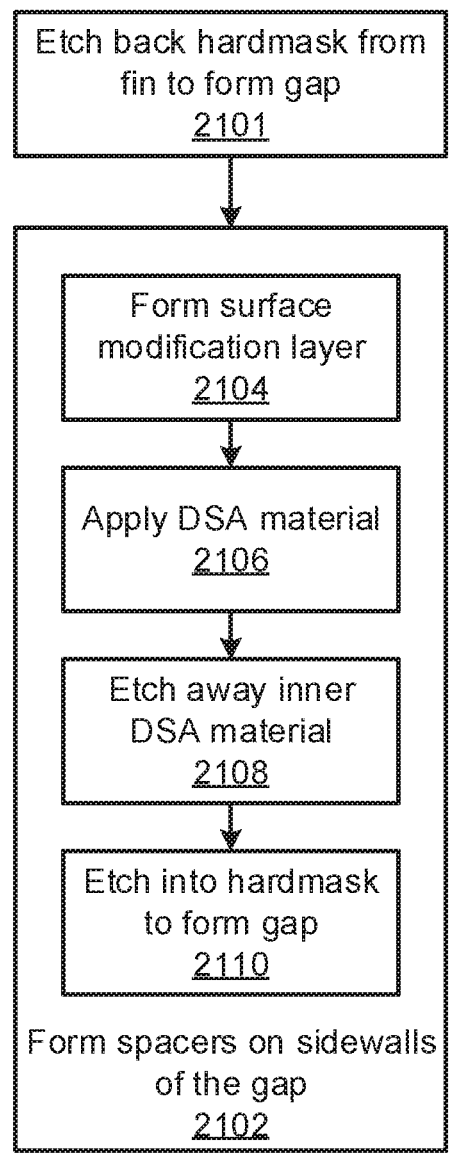
FIG. 21 is a block/flow diagram of a method of forming spacers that expose a central portion of the stack of alternating layers in accordance with an embodiment of the present invention.

Referring now to FIG. 21, an alternative process for fabrication of a gate-all-around FET is shown. Although a conformal deposition process is described above to form the spacers 502 in the gap 402, this is best suited to embodiments where all devices on the chip share a single nanosheet width. If there are devices having different nanosheet widths, block 2010 can optionally be implemented using directed self-assembly to form structures that have a fixed-width inner portion and variable-width outer portions.

In particular, blocks 2101 and 2102 replace blocks 2008 and 2010 in FIG. 20 for this embodiment. Rather than etching away the hardmask 304, block 2101 etches the hardmask back to form a recess, leaving a portion of the hardmask behind. In some embodiments, this can be accomplished using a dual-layer hardmask, where only the top layer is selectively etched away in block 2101. In other embodiments, a timed etch can be used.

Block 2102 then forms spacers on the sidewalls of the recess using a directed self-assembly process. Block 2104 forms a surface modification layer in the recess. Block 2106 then applies the directed self-assembly material, which self-assembles on the surface modification layer to form an inner portion formed from a first material and outer portions formed from a second, selectively etchable material. Block 2108 etches away the inner portion, leaving the outer portions to define a central gap. Block 2110 then etches down into the remaining hardmask using the outer portions as a mask. From this point, the etched hardmask can be used in place of the sidewall spacers 502, but with a thickness that will vary in accordance with the channel width. This makes it possible to form a central opening in the channel layers 108 that is consistent from device to device, even if the overall channel width varies.

Figure 22:
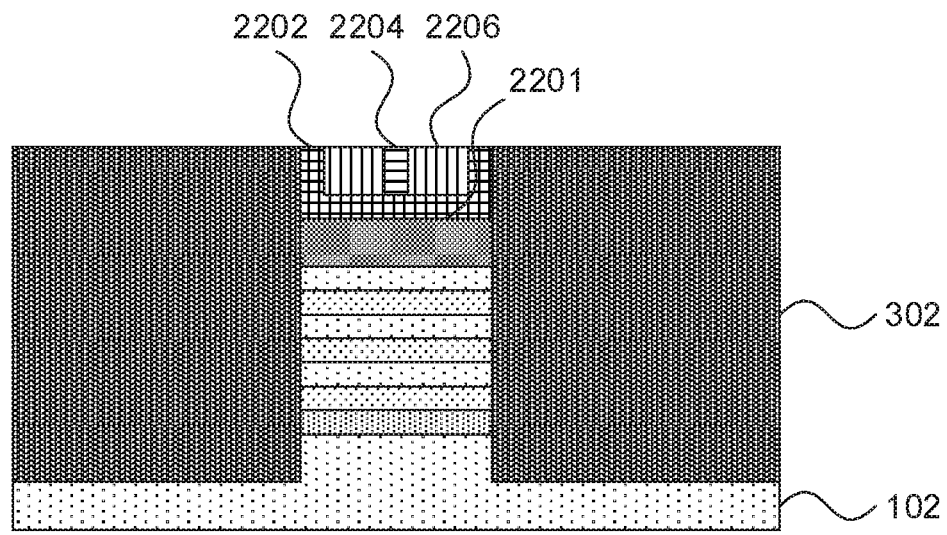
FIG. 22 is a cross-sectional view of a step in the formation of a semiconductor device having improved electrostatic integrity, showing the formation of a directed self-assembly spacers.

Referring now to FIG. 22, a cross-sectional view of an alternative step in the formation of a gate-all-around FET is shown. The recessed hardmask 2201 is shown, with the surface modification layer 2202 conformally formed in the recess. The self-assembled inner portion 2204 is shown between the self-assembled outer portions 2206, defining the space that will be etched away in the recessed hardmask 2201 and in the fin 202 below.

Figure 23:
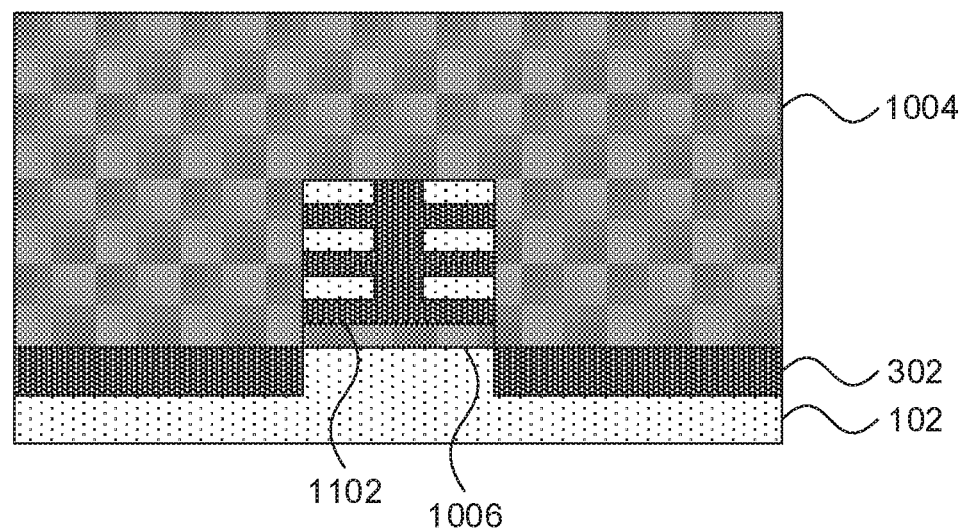
FIG. 23 is a cross-sectional view of a step in the formation of a semiconductor device having improved electrostatic integrity, showing the cross-sectional structure of the inner spacers.

Referring now to FIG. 23, a cross-sectional view of a step in the formation of a gate-all-around FET is shown, being taken perpendicular to the fin 202 and through the inner spacers 1102. This view shows the structure of the inner spacers, with the central portion connecting horizontal layers of dielectric material. The channels 106 have a shared bottom dielectric isolation 1006.

Having described preferred embodiments of nanosheet devices with high effective channel length and electrostatic integrity (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a semiconductor device, comprising:
    forming spacers on respective sidewalls above a stack of alternating channel layers and sacrificial layers, leaving an opening between the spacers;
    etching down into the stack, between the spacers, to form a central opening in the stack that separates the channel layers into respective pairs of channel structures;
    etching away the sacrificial layers to expose top and bottom surfaces of the channel structures; and
    forming a gate stack on, between, and around the channel structures, including in the central opening between pairs of channel structures.

2. The method of claim 1, further comprising depositing sacrificial material in the central opening in the stack, the sacrificial material connecting the sacrificial layers to form a sacrificial structure.

3. The method of claim 2, further comprising:
    forming a dummy gate over the stack;
    forming spacers on sidewalls of the dummy gate; and
    etching away the dummy gate, wherein etching away the sacrificial layers is performed after etching away the dummy gate and further includes etching away the sacrificial structure between vertically adjacent channel structures as well as between horizontally adjacent channel structures.

4. The method of claim 3, further comprising forming inner spacers by recessing the sacrificial structure relative to the channel structures and depositing a dielectric material in the recesses.

5. The method of claim 4, wherein the inner spacers have a vertical central portion and a plurality of horizontal portions that extend outward from sides of the central portion, between the channel structures.

6. The method of claim 3, further comprising:
    etching away the stack of alternating channel layers and sacrificial layers in regions that are not covered by the dummy gate after forming the dummy gate; and
    growing source/drain structures from exposed sidewalls of the channel structures.

7. The method of claim 1, wherein forming the spacers comprises:
    depositing a directed self-assembly material in a recess above the stack to form an inner portion and outer portions;
    etching away the inner portion to form an opening between the outer portions; and
    etching down into a dielectric layer above the stack to form the spacers and the opening between the spacers.

8. The method of claim 1, further comprising forming the stack of alternating channel layers and sacrificial layers on a base layer.

9. The method of claim 8, further comprising etching away the base layer before etching away the sacrificial layers.

10. The method of claim 9, further comprising depositing a bottom isolation layer under the stack of alternating channel layers after etching away the base layer and before etching away the sacrificial layers.

11. A method of forming a semiconductor device, comprising:
- forming spacers on respective sidewalls above a stack of alternating channel layers and sacrificial layers, leaving an opening between the spacers;
- etching down into the stack, between the spacers, to form a central opening in the stack that separates the channel layers into respective pairs of channel structures;
- depositing sacrificial material in the central opening in the stack, the sacrificial material connecting the sacrificial layers to form a sacrificial structure;
- forming a dummy gate over the stack;
- etching away the stack of alternating channel layers in regions not covered by the dummy gate;
- forming inner spacers by recessing the sacrificial structure relative to the channel structures and depositing a dielectric material in the recesses;
- growing source and drain regions from sidewalls of the channel structures;
- etching away the sacrificial structure to expose top and bottom surfaces of the channel structures; and
- forming a gate stack on, between, and around the channel structures, including in the central opening between pairs of channel structures.

12. The method of claim 11, further comprising:
- forming spacers on sidewalls of the dummy gate; and
- etching away the dummy gate, wherein etching away the sacrificial structure is performed after etching away the dummy gate and further includes etching away the sacrificial structure between vertically adjacent channel structures as well as between horizontally adjacent channel structures.

13. The method of claim 12, wherein the inner spacers have a vertical central portion and a plurality of horizontal portions that extend outward from sides of the central portion, between the channel structures.

14. The method of claim 11, wherein forming the spacers comprises:
- depositing a directed self-assembly material in a recess above the stack to form an inner portion and outer portions;
- etching away the inner portion to form an opening between the outer portions; and
- etching down into a dielectric layer above the stack to form the spacers and the opening between the spacers.

15. The method of claim 11, further comprising etching away the base layer before etching away the sacrificial structure.

16. The method of claim 11, further comprising depositing a bottom isolation layer under the stack of alternating channel layers after etching away the base layer and before etching away the sacrificial structure.

* * * * *